US006424206B2

(12) United States Patent
Takahashi et al.

(10) Patent No.: US 6,424,206 B2
(45) Date of Patent: Jul. 23, 2002

(54) INPUT CIRCUIT AND OUTPUT CIRCUIT

(75) Inventors: Hiroyuki Takahashi; Yuuji Matsui, both of Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/886,715

(22) Filed: Jun. 21, 2001

(30) Foreign Application Priority Data

Jun. 23, 2000 (JP) ....................................... 2000-190112

(51) Int. Cl.[7] .................................................. G11C 7/00
(52) U.S. Cl. ....................................... 327/546; 327/427
(58) Field of Search ................................ 327/355, 361, 327/427, 434, 437, 538, 543, 545, 546, 574, 581, 595; 323/282, 288, 289

(56) References Cited

U.S. PATENT DOCUMENTS 5,654,571 A * 8/1997 Tsuji .......................... 257/357
6,005,436 A * 12/1999 Shibayama et al. ......... 327/546
6,072,357 A * 6/2000 Jo .............................. 327/536

* cited by examiner

*Primary Examiner*—Matthew Nguyen
(74) *Attorney, Agent, or Firm*—Hayes Soloway P.C.

(57) ABSTRACT

The output circuit of the present invention which produces an external signal at a first voltage from an internal signal at a reduced second voltage and which outputs the external signal from an output terminal, comprises: first and second MOS transistors having drains connected to the output terminal, and having gates connected to a control signal line; a third MOS transistor having a source connected to a power source of the first voltage, and having a drain connected to a source of the first MOS transistor; a fourth MOS transistor having a source connected to a ground, having a drain connected to a source of the second MOS transistor, and having a gate connected to an internal signal line; a voltage changer, which changes the voltage of the internal signal, connected to the gate of the third MOS transistor; a first capacitor connected between a gate of the first MOS transistor and a gate of the third MOS transistor; and a second capacitor connected between a gate of the second MOS transistor and a gate of the fourth MOS transistor.

13 Claims, 8 Drawing Sheets

① The decreasing of the output is slow because the gate voltage is low.
② The increasing of the output is slow because the decreasing the voltage at the point P is slow.

INPUT CIRCUIT AND OUTPUT CIRCUIT

BACKGROUND OF THE INVENTION

1. Field of the Invention

The present invention relates to a semiconductor device which has an internal voltage reduction circuit for providing an internal voltage by reducing an external voltage.

2. Description of the Related Art

Recently, the degree of integration of semiconductor integrated circuits has increased. MOS transistors have become smaller in order to provide many functions in one chip.

The accuracy of processing machines has also improved, and therefore the size of MOS transistors can be easily reduced.

However, as the MOS transistors become smaller, a source voltage for circuits which comprise semiconductor integrated circuits, that is, the voltage of an external power source supplied to the internal circuit of the semiconductor integrated circuit, may be more likely to deteriorate the internal MOS transistors.

Although the size of the MOS transistor is being reduced, the operating voltage of the MOS transistors has not changed (it has is not been reduced). Therefore, the voltage can exceed the withstand voltage of the MOS transistors, reducing the reliability.

The operating voltage of the MOS transistor is set according to standards (or working conditions) independently from the reduced size of the MOS transistors. Since the size of MOS transistors is being reduced, the standards for semiconductor integrated circuits using the MOS transistors should be revised. However, the operating voltage according to the standards have not been reduced.

Therefore, as shown in FIG. 9, an internal voltage reduction circuit 100 provided in the semiconductor integrated circuit reduces the voltage VEX (for example, 3.3 V) from an external power source to an internal voltage VINT (for example, 2.0 V) which meets the withstand voltage of the reduced MOS transistors, and supplies the internal voltage to the internal circuit 101.

Thus, the electric power consumption can be reduced in the operation of the semiconductor integrated circuit.

However, the input circuit 102 and the output circuit 103 must be capable of withstanding the voltage VEX from the external power source.

That is, in a p-channel MOS transistor 104 in the input circuit 102, when the voltage of an input signal IN is at the H level, the withstand voltage between a drain with a substrate and a gate is exceeded. When the voltage of the input signal IN is at the L level, the withstand voltage between a source and the gate is exceeded.

In an n-channel MOS transistor in the input circuit 102, when the voltage of the input signal IN is at the H level, the withstand voltage between the source and the gate is exceeded, and when the voltage of the input signal IN is at the L level, the withstand voltage between the drain with a substrate and the gate is exceeded.

Similarly, in a p-channel MOS transistor 106 in the output circuit 103, when a signal INO is at the H level, the withstand voltage between the source and the gate is exceeded, and when the signal INO is at the L level, the withstand voltage between the drain with a substrate and the gate is exceeded.

In an n-channel MOS transistor 107 in the input circuit 103, when the signal INO is at the H level, the withstand voltage between a source and a gate is exceeded, and when the signal INO is at the L level, the withstand voltage between a drain with a substrate and a gate is exceeded. The voltage of the signal INO at the H level is changed from the internal voltage VINT to the external voltage VEX by a level shift circuit 108.

Thus, the input circuit 102 and the output circuit 103 must be capable of the voltage VEX of the external power source to send and receive signals to and from an external circuit.

Therefore, for the MOS transistor to have a gate which withstands the voltage VEX of the external power source, the oxide film of the gate of the MOS transistor must have a thickness which allows it to withstand the voltage VEX of the external power source.

According to the above structure, the semiconductor integrated circuit has input circuit 102 and output circuit 103 with gates which can withstand the voltage of the external power source.

However, the process for manufacturing the semiconductor integrated circuit must produce two kinds of MOS transistors. One of the MOS transistors has a thin gate oxide film (with a thickness of 4 nm), while the other MOS transistor has a thick gate oxide film (with a thickness of 9 nm).

Because two kinds of gate oxide films with different thicknesses must be produced, at least four extra steps are required as compared with the normal manufacturing process for producing gate oxide films with the same thickness. Therefore, the manufacturing costs are increased, and the price of the produced chip is also disadvantageously increased.

To solve this problem, a circuit structure in which the gate oxide films in the MOS transistors which constitute the input circuit and the output circuit and the gate oxide films in the MOS transistors which constitute the internal circuit have the same thickness has been proposed.

In the input circuit shown in FIG. 10, the voltage reduction circuit 115 reduces the external voltage VEX to the internal voltage VINT, and supplies the voltage VINT to the internal circuit. When the voltage of the input signal IN is at the L level, the voltage of a source and a gate of a p-channel MOS transistor 110 is within the withstand voltage. Thus, the withstand voltage is satisfied.

Because a p-channel transistor 112 whose gate is connected to ground is inserted between a MOS transistor 110 and an n-channel MOS transistor 113, the voltage at the drain of the MOS transistor 110 is reduced. When the voltage of the input signal IN is at the H level, the voltage between the drain and the gate of the MOS transistor 110 is within the withstand voltage. Thus, the withstand voltage is satisfied.

The phrase "the voltage is within the withstand voltage (satisfy the withstand voltage)" means that a voltage less than the withstand voltage of the gate oxide film of the MOS transistor is applied between a gate and a source (or a drain).

Similarly, an n-channel MOS transistor 114 is inserted between a gate of an n-channel MOS transistor 113 and an input terminal 116 (which is connected to an external pad).

When the input signal IN is at the H level, the voltage of the signal at the H level (the voltage VEX of the external power source) applied to the gate of the MOS transistor 113 is reduced to VEX−VTN by a threshold voltage VTN of a MOS transistor 114 so that the voltage between the gate and the source of the MOS transistor 113 is within the withstand voltage.

When the input signal IN is at the L level, the voltage of the signal at the L level (the ground level) applied to the gate of the MOS transistor 113 is increased to VTP by the threshold voltage VTP of the MOS transistor 114, and the voltage applied to the drain is changed to the internal voltage VINT by a voltage reduction circuit 115. Thus, the withstand voltage of the gate and the drain of the MOS transistor 113 is satisfied.

In the output circuit shown in FIG. 11, a p-channel MOS transistor 120, a p-channel MOS transistor 121, an n-channel transistor 122, and an n-channel MOS transistor 123 are connected in series.

The source of the MOS transistor 120 is connected to a terminal at an external voltage VEX. The signal SB output from the level shifter 125 is input to the gate of the MOS transistor 120. The drain of the MOS transistor 120 is connected to a source of the MOS transistor 121.

The control signal SP at a voltage VSP is continuously input from the reference power source 126 to the gate of the MOS transistor 121. the control signal SN at a voltage VSN is continuously input from the reference power source 126 to the gate of the MOS transistor 122.

When the MOS transistor 120 is turned on, the voltage VSP of the control signal SP sets the voltage between the gate and the source (or the drain) of the MOS transistor 121 to less than the withstand voltage of the gate oxide film, and turns on the MOS transistor 121.

Similarly, when the MOS transistor 123 is turned off, the voltage VSN of the control signal SN sets the voltage between the gate and the source (or the drain) of the MOS transistor 122 to less than the withstand voltage of the gate oxide film, and turns on the MOS transistor 122.

A signal SB which has been changed from the voltage of the signal SA by the level shifter 125 is input to the gate of the MOS transistor 120. The level shifter 125 has changed the signal SA at the H level which is the internal voltage VINT from the internal circuit to the voltage VEX at the H level, and has changed the signal SA at the L level which is the ground voltage from the internal circuit to the voltage VL at the L level.

The voltage VL sets the voltage between the gate and the drain (or the source) of the MOS transistor 120 to less than the withstand voltage of the gate oxide film, and is a voltage for turning on the MOS transistor 120.

When the signal SA at the H level is input while the MOS transistors 121 and 122 are in the ON-state, the signal SB is increased to the H level so that the MOS transistor 120 is turned off, the signal SA is changed to the H level which is the internal voltage VINT so that the MOS transistor 123 is turned on, and the output circuit outputs an output signal OUT at the L level which is the ground level.

When the signal SA at the L level is input while the MOS transistors 121 and 122 are in the ON-state, the signal SB is changed to the voltage VL so that the MOS transistor 120 is turned on, the signal SA is changed to the L level so that the MOS transistor 123 is turned off, and the output circuit outputs the output signal OUT at the H level which is the external voltage VEX.

In the above-mentioned input circuit, the MOS transistor 114 for reducing the voltage VEX of the externally input signal IN is inserted between the gate of the MOS transistor 113 and the input terminal 116. Therefore, the rising and lowering of the signal applied to the gate of the MOS transistor 113 are slow, and the voltage applied to the gate of the MOS transistor 113 is lowered to VINT−VTN by the threshold voltage of the MOS transistor 114, delaying the supply of the signal INS to the internal circuit. Thus, there is the problem in that the operating speed of the semiconductor integrated circuit is decreased.

That is, the rising of the input signal IN from the L level to the H level, and the lowering of the input signal IN from the H level to the L level which are the variations of the signal level input to the gate of the MOS transistor 113 are delayed by a time constant determined by the resistance component of the MOS transistor 114 and the gate capacity of the MOS transistor 113.

In the above-mentioned output circuit, when the voltage level of the output signal OUT is changed from the L level to the H level, the voltages at the drain and the source of the MOS transistor 121 are suddenly increased. Then, because of the parasitic capacitance of the gate and the source of the MOS transistor 121, as the voltages at the drain and the source are increased, the voltage VSP of the control signal SP is increased, the MOS transistor 121 is turned off, and therefore the rise of the output signal OUT from the L level to the H level is disadvantageously delayed.

The parasitic capacitance of the gate and source includes a capacitance component of the overlapping section of the source electrode and the gate electrode of the MOS transistor, and a capacitance component between the sides of the source electrode and the gate electrode.

Further, in the above-mentioned output circuit, when the voltage level of the output signal OUT is changed from the H level to the L level, the voltage at the drain of the MOS transistor 122 is reduced. Then, because of the parasitic capacitance of the gate and the drain of the MOS transistor 122, as the voltage VSN of the control signal SN is decreased, the MOS transistor 122 is turned off, and therefore the rise of the output signal OUT from the H level to the L level is disadvantageously delayed.

To prevent the variations of the voltages VSP and VSN in the above-mentioned output circuit, the performance for driving the control signals SP and SN in the reference power source may be increased. However, this method significantly increases the electric power consumption of the reference power source 126.

BRIEF SUMMARY OF THE INVENTION

It is therefore an object of the present invention to provide a semiconductor device which does not increase the number of steps in the manufacturing process, which eliminates delays in the input and output signals, and which improves the reliability of the input circuit and the output circuit.

In the first aspect of the present invention, the output circuit which produces an external signal at a first voltage from an internal signal at a reduced second voltage and which outputs the external signal from an output terminal, comprises; first and second MOS transistors having drains connected to the output terminal, and having gates connected to a control signal line; a third MOS transistor having a source connected to a power source of the first voltage, and having a drain is connected to a source of the first MOS transistor; a fourth MOS transistor having a source is connected to a ground, having a drain connected to a source of the second MOS transistor, and of which gate is connected to an internal signal line; a voltage changer, which changes the voltage of the internal signal, connected to the gate of the third MOS transistor; a first capacitor connected between a gate of the first MOS transistor and a gate of the third MOS transistor; and a second capacitor connected between a gate of the second MOS transistor and a gate of the fourth MOS transistor.

In the second aspect of the present invention, the first, second, third, and fourth MOS transistors, the voltage changer, the first and second capacitor are formed in a semiconductor integrated circuit.

In the third aspect of the present invention, a capacitance of the first capacitor is the same as a parasitic capacitance between the gate and the drain of the first MOS transistor, and a capacitance of the second capacitor is the same as a parasitic capacitance between the gate and the drain of the second MOS transistor.

In the fourth aspect of the present invention, the voltage changer outputs the control signal at the first voltage when the internal signal is at the ground voltage, and outputs the control signal at a voltage less than a withstand voltage of a gate oxide film when the internal signal at the second voltage.

In the fifth aspect of the present invention, the output circuit which produces an external signal at a first voltage from an internal signal at a reduced second voltage and which outputs the external signal from an output terminal, comprises: first and second MOS transistors having drains connected to the output terminal, and having gates connected to a control signal line; a third MOS transistor having a source connected to a power source of the first voltage, and having a drain connected to a source of the first MOS transistor; a fourth MOS transistor having a source is connected to a ground, having a drain connected to a source of the second MOS transistor, and having a gate connected to an internal signal line; a voltage changer, which changes the voltage of the internal signal, connected to the gate of the third MOS transistor; a first diode connected between a gate of the first MOS transistor and a gate of the third MOS transistor; and a second diode connected between a gate of the second MOS transistor and a gate of the fourth MOS transistor.

In the sixth aspect of the present invention, the first, second, third, and fourth MOS transistors, the voltage changer, the first and second diodes are formed in a semiconductor integrated circuit.

In the seventh aspect of the present invention, the number of the first diodes connected in series is adjusted depending on a difference in voltage between the gate of the third transistor and the gate of the first transistor, and the number of the second diodes connected in series is adjusted depending on a difference in voltage between the gate of the second transistor and the gate of the third transistor.

In the eighth aspect of the present invention, the voltage changer outputs the control signal at the first voltage when the internal signal is at the ground voltage, and outputs the control signal at a voltage less than a withstand voltage of a gate oxide film when the internal signal at the second voltage.

In the ninth aspect of the present invention, the input circuit which produces an internal signal at a reduced second voltage from an external signal at a first voltage and which inputs the internal signal to an input terminal, comprises: a first MOS transistor having a source connected to a first terminal at the second voltage, and having a gate connected to the input terminal, a second MOS transistor having a source connected to a drain of the first MOS transistor, and having a gate connected to a ground; a third MOS transistor having a drain connected to a drain of the second MOS transistor, and having a source connected to the ground; a fourth MOS transistor having a source connected to a gate of the third MOS transistor, having a gate connected to a line at the second voltage, and having a drain connected to the input terminal; and a capacitor connected between a gate of the third MOS transistor and the input terminal.

In the tenth aspect of the present invention, the first, second, third, and fourth MOS transistors, and the capacitor are formed in a semiconductor integrated circuit.

In the eleventh aspect of the present invention, the input circuit further comprises a diode connected between the gate of the third MOS transistor and the input terminal in parallel to the capacitor.

In the twelfth aspect of the present invention, the input circuit further comprises a diode connected between a power source of the first voltage and the first terminal.

In the thirteenth aspect of the present invention, a capacitance of the capacitor is set so that a voltage between the gate and the source, or the drain, of the third MOS transistor does not exceed a withstand voltage of a gate oxide film when the input terminal is increased to the first voltage.

According to the output circuit of the present invention, the first and second capacitors transmit the variations of the control signal and the internal signal to the gates of the first and second MOS transistors. Therefore, variations (increases or decreases) of the voltages of the gates of the first and second MOS transistors can be prevented. Thus, the operation of the first and second MOS transistors is stabilized, the delay between a change in the internal signal and a change in the external signal is shortened, and the operating speed can be increased.

According to the input circuit of the present invention, the capacitor allows the voltage at the gate of the third MOS transistor (23) to follow the change of the voltage of the input signal. The switching ON or OFF of the third MOS transistor can be performed at a high speed. Thus, the delay between a change in the internal signal and a change in the external signal is shortened, and the operating speed can be increased.

As a result, the number of steps in the manufacturing process can be reduced (four steps can be eliminated) as compared with the process for manufacturing the conventional integrated circuit with MOS transistors with different thicknesses of the input circuit and the output circuit. Therefore, the production time can be shortened, the manufacturing costs can be reduced, and the prices of the chips can be reduced.

DETAILED DESCRIPTION OF THE INVENTION

The embodiments of the present invention will be explained with reference to the drawings.

First Embodiment

Figure 1:
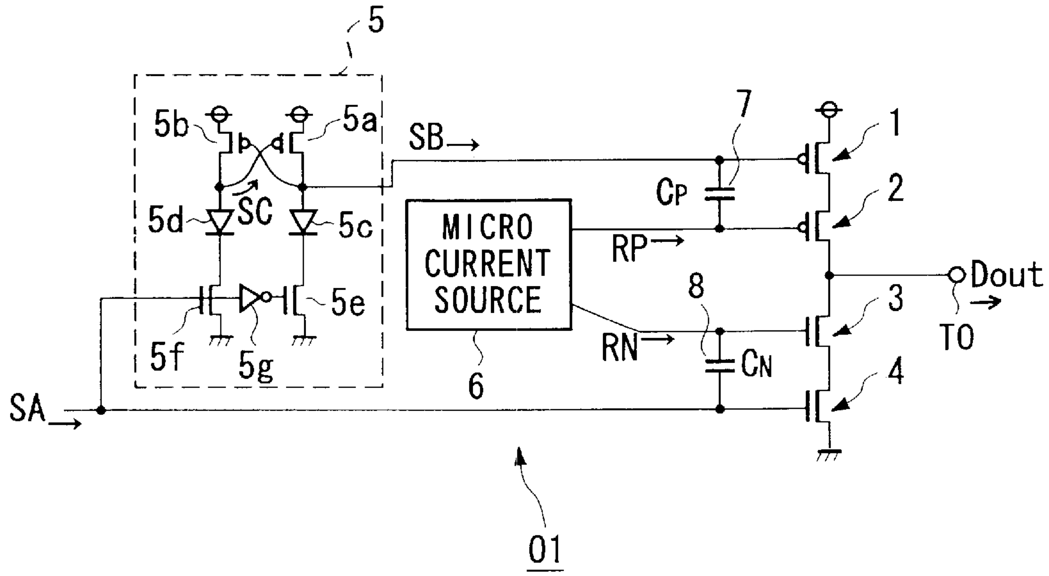
FIG. 1 is a block diagram showing the output circuit of the first embodiment of the present invention.

FIG. 1 is a block diagram showing the structure of the output circuit of the first embodiment of the present invention. The output circuit O1 is used instead of the output circuit 103 in the semiconductor integrated circuit. A voltage VEX is supplied from an external power source through an external terminal to the semiconductor integrated circuit.

An internal voltage reduction circuit 100 changes the voltage VEX into an internal voltage VINT, which is output as a voltage for driving an internal circuit 101.

In FIG. 1, in the output circuit O1, a p-channel MOS transistor 1, a p-channel MOS transistor 2, an n-channel MOS transistor 3, and an n-channel MOS transistor 4 are connected in series. The gate oxide films of the MOS transistors have the same thickness as those of the MOS transistors in the internal circuit 101.

That is, the MOS transistors in the internal circuit 101 are formed by the gate oxide films with a thickness corresponding to the scaling law for he fine structure. The internal voltage circuit 100 reduces the external voltage VEX to an internal voltage VINT which does not exceed the withstand voltage of the gate oxide film of the MOS transistor in the internal circuit 101.

The source of the MOS transistor 1 is connected to a terminal of an external power source for supplying the voltage VEX. A level shifter 5 outputs a signal SB to the gate of the MOS transistor 1. The drain of the MOS transistor I is connected to the source of the MOS transistor 2.

The drain of the MOS transistor 2 is connected to the drain of the MOS transistor 3. The connecting point of the drain of the MOS transistor 2 and the drain of the MOS transistor 3 is connected to an external terminal TO. The output circuit O1 changes the voltage of the internal signal SA into a signal DOUT, and outputs the signal DOUT from the external terminal TO.

A control signal at a voltage VRP is continuously input from a micro electric current power source 6 to the gate of the MOS transistor 2, and a control signal RN at a voltage VRN is continuously input from the micro electric current power source 6 to the gate of the MOS transistor 3.

The drain of the MOS transistor 4 is connected to the source of the MOS transistor 3, a signal SA is input to the gate of the MOS transistor 4, and the source of the MOS transistor 4 is connected to the ground.

When the MOS transistor 1 is in the ON-state, the voltage VRP of the control signal RP sets the voltage between the gate and the source (or, the drain) of the MOS transistor 2 to less than the withstand voltage of the gate oxide film of the MOS transistor 2, and turns on the MOS transistor 2.

The withstand voltage means the upper limit of an allowable voltage which ensures the reliability of the gate oxide film.

Similarly, when the MOS transistor 4 is in the OFF-state, the voltage VRN of the control signal RN sets the voltage between the gate and the drain (or, the source) of the MOS transistor 3 to less than the withstand voltage of the gate oxide film of the MOS transistor 3, and turns on the MOS transistor 3.

The level shifter 5 comprises a p-channel MOS transistor **5*a*, a diode 5*c*, and an n-channel MOS transistor 5*e* which are connected in series, a p-channel MOS transistor 5*b*, a diode 5*d*, and an n-channel MOS transistor 5*f* which are connected in series, and an inverter 5*g*** for inverting the signal SA.

That is, the source of the MOS transistor **5*a* is connected to the terminal of the external power source for supplying the voltage VEX, the gate of the MOS transistor 5*a* is connected to the drain of the MOS transistor 5*b*, and the source of the MOS transistor 5*a* is connected to the anode of the diode 5*c***.

The diode **5*c* is inserted to set the L level of the signal SB to the voltage V. The cathode of the diode 5*c* is connected to the drain of the MOS transistor 5*e***.

Because the gate of the MOS transistor **5*e* is connected to the output terminal of the inverter 5*g*, the gate receives a signal which is an inversion of the signal SA. The source of the MOS transistor 5*e*** is connected to the ground.

The source of the MOS transistor **5*b* is connected to the terminal of the external power source for supplying the voltage VEX, the gate of the MOS transistor 5*b* is connected to the drain of the MOS transistor 5*a*, and the source of the MOS transistor 5*b* is connected to the anode of the diode 5*d***.

The diode **5*d* is inserted to set the L level of a signal SC to the voltage VL. The cathode of the diode 5*d* is connected to the drain of the MOS transistor 5*f***.

The signal SA is input to the gate of the MOS transistor **5*f*, and the source of the MOS transistor 5*f*** is connected to ground.

The level shifter 5 converts the signal SA at the H level which is the internal voltage VINT from the internal circuit 101 into the signal SB at the H level which is the voltage VEX, and outputs the signal SB.

That is, since the signal SA is at the H level, the MOS transistor **5*f* is turned on, the signal SC is at the level of the voltage VL, the MOS transistor 5*a* is turned on, and the MOS transistor 5*e*** is turned off.

The signal SB is at the H level which is the voltage VEX, and the MOS transistor **5*b*** is turned off.

Thus, the level shifter 5 outputs the signal SB at the H level of the voltage VEX.

The level shifter 5 changes the signal SA at the L level which is the ground voltage from the internal circuit 101 into the signal SB at the L level of the voltage VL, and outputs the signal SB.

That is, when the signal SA is at the L level, the MOS transistor **5*f* is turned off, the MOS transistor 5*e* is turned on, the signal SB is at the level of the voltage VL, and the MOS transistor 5*b*** is turned on.

Then, the signal SC is at the H level, and the MOS transistor **5*a*** is turned off.

Thus, the level shifter 5 outputs the signal SR at the L level of the voltage VL.

The voltage VL sets the voltage between the gate and the drain (or the source) of the MOS transistor 1 to less than the withstand voltage of the gate oxide film, and turns on the MOS transistor 1.

Thus, while the MOS transistors 2 and 3 are in the ON-state, the MOS transistor 4 is turned off in response to the input of the signal SA at the L level, the MOS transistor 1 is turned on in response to the input of the signal SB of the voltage VL, and the output circuit O1 outputs an output signal OUT at the H level which is the voltage VEX of the external power source since the signal SA is at the L level.

While the MOS transistors 2 and 3 are in the ON-state, the signal SB is increased to the H level which is the voltage VEX of the external power source in response to the signal SA at the H level which is the voltage VINT of the internal power source. When the MOS transistor 1 is in the ON-state, the MOS transistor 4 is turned on in response to the input of the signal SA at the H level, and the output circuit O1 outputs the output signal OUT at the L level which is the ground level.

A capacitor Cp is inserted between the gate of the MOS transistor 1 and the gate of the MOS transistor 2.

When the voltage of an output signal DOUT is changed from the L level to the H level, the capacitor Cp prevents the variations of the voltage VRP. That is, the parasitic capacitance between the gate and the drain of the MOS transistor 2 has a tendency to increase the voltage VRP applied to the gate of the MOS transistor 2 as the output signal DOUT is increased. The capacitor Cp suppresses the tendency to increase of the voltage VRP by lowering the voltage VRP applied to the gate as the signal SB is changed to the L level.

A capacitor Cn is inserted between the gate of the MOS transistor 3 and the gate of the MOS transistor 4.

The capacitor Cn prevents variations of the voltage VRN. That is, the parasitic capacitance has a tendency to decrease the voltage VRN applied to the gate of the MOS transistor 3 as the output signal DOUT is decreased. The capacitor Cp compensates the tendency to decrease of the voltage VRN by increasing the voltage VRN applied to the gate.

The capacitance of the capacitor Cp matches the parasitic capacitance between the gate and the drain of the MOS transistor 2, and the capacitance of the capacitor Cn matches the parasitic capacitance between the gate and the drain of the MOS transistor 3.

The capacitors Cp and Cn use MOS transistors with the same form as the MOS transistors 2 and 3 in order to make the capacitors Cp and Cn compatible with the characteristics of the MOS transistors 2 and 3.

Figure 2:
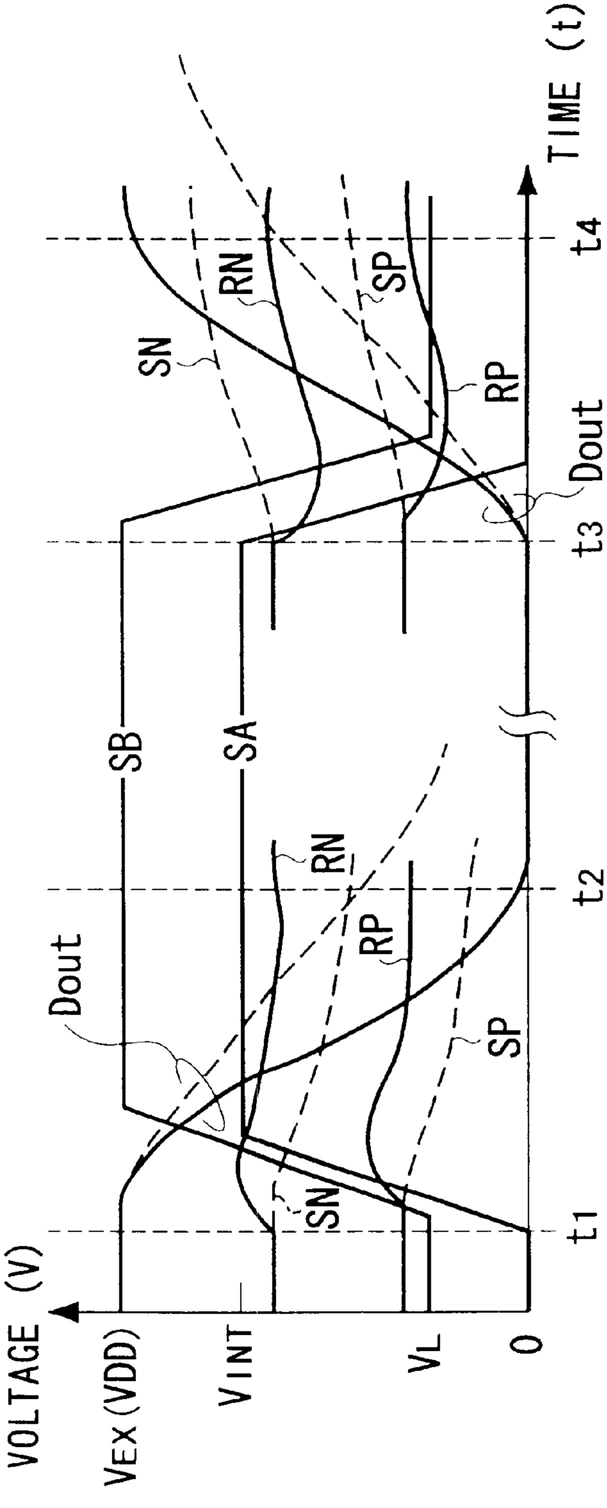
FIG. 2 is a timing chart showing the operation of the output circuit of the first embodiment of the present invention.

The operation of the embodiment will now be explained with reference to FIGS. 1 and 2. FIG. 2 is a timing chart for explaining the operation in FIG. 1.

At the time t1, the internal circuit 101 begins to change the signal SA from the L level to the H level. As the voltage of the signal SA is increased, the voltage of the signal SB is increased from the voltage VL.

Since the voltages of the signals SA and SB are gradually increased, the voltage of the output signal DOUT gradually decrease from the voltage VEX as the MOS transistor 4 is being turned on, and while the MOS transistor 1 is being turned off.

Figure 11:
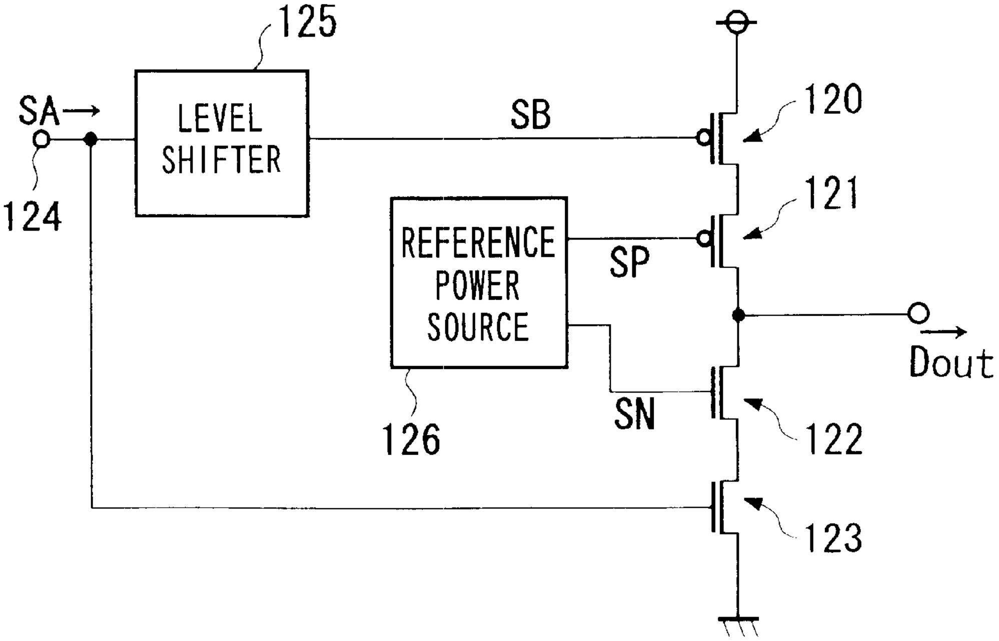
FIG. 11 is a block diagram showing the structure of the conventional output circuit.

In FIG. 2, the output signal DOUT is indicated by two lines which are a solid line and the dashed line. The solid line indicates the operation of the output circuit O1 of the first embodiment shown in FIG. 1. The dashed line indicates the operation of the conventional output circuit shown in FIG. 11.

As is obvious from FIG. 2, in a conventional output circuits, as the voltages at the source and the drain of the MOS transistor 3 are varied, the voltage at the drain of the MOS transistor 3 is decreased, and the voltage VSN of the control signal SN decreases because of the parasitic capacitance between the drain and the gate of the MOS transistor 3.

Further, in the conventional output circuits, the voltages at the source and the drain of the MOS transistor 2 are varied, the voltage at the drain of the MOS transistor 2 is decreased, and the voltage VSP of the control signal SP is decreased because of the parasitic capacitance between the drain and the gate of the MOS transistor 2.

As the voltage VSN of the control signal SN and the voltage VSP of the control signal SP are decreased, the ON-resistance of the MOS transistor 3 is increased, and the ON-resistance of the MOS transistor 2 is decreased. Therefore, the decrease of the voltage of the output signal DOUT is slow. That is, the change of the output signal DOUT from the H level to the L level is significantly delayed from the change of the signal SA from the L level to the H level.

In contrast, in the output circuit O1 of the first embodiment, as the voltage of the signal SA input to one terminal of the capacitor Cp is increased, the voltage VRP of the signal RP transferred through the connection to the other terminal is also increased.

Therefore, the output circuit O1 of the first embodiment prevents the decrease of the voltage VRP of the control signal RP. The voltages at the source and the drain of the MOS transistor 2 has a tendency to decrease as the voltage of the output signal DOUT is decreased. That is, the voltage VRP of the control signal RP applied to the gate which is one of the terminals of the parasitic capacitance has a tendency to decrease as the voltage at the drain which is the other terminal of the parasitic capacitance is decreased. The output circuit O1 compensates the tendency to decrease the voltage VRP by the capacitor Cp which has a tendency to increase the voltage VRP.

Similarly, in the output circuit O1 of the first embodiment, as the voltage of the signal SB input to one terminal of the capacitor Cp is increased, the voltage VRN of the signal RN transferred through the connection to the other terminal has a tendency to increase.

Therefore, the output circuit O1 of the first embodiment prevents the decrease of the voltage VRN of the control signal RN. The voltages at the source and the drain of the MOS transistor 3 has a tendency to decrease as the voltage of the output signal DOUT is decreased. That is, the voltage VRN of the control signal RN applied to the gate which is one of terminals of the parasitic capacitance has a tendency to decrease as the voltage at the drain which is the other terminal of the parasitic capacitance is decreased. The output circuit O1 compensates the tendency to decrease of the voltage VRN by the capacitor Cn which has a tendency to increase the voltage VRN.

Next, at the time t2, the output signal DOUT from the output circuit O1 of the first embodiment is decreased to the ground potential.

In conventional output circuits, as the voltage VSN of the control signal SN and the voltage VSP of the control signal SP are decreased, the ON-resistance of the MOS transistor 3 is increased, and the ON-resistance of the MOS transistor 2 is decreased. Therefore, the decrease of the voltage of the output signal DOUT from the H level to the L level is slow, and the voltage of the output signal DOUT does not reach the ground voltage.

Thus, the capacitors Cp and Cn transmit the increasing voltages of the signals SB and SA to the connections transferring the control signals RP and RN. This compensates for the decrease of the voltage VRP of the control signal RP and the voltage VRN of the control signal RN as the output signal DOUT is varied. Therefore, the delay between a change in the signal SA and a change in the signal DOUT is shortened, and the operating speed can be increased.

Even when the voltage VRP of the control signal RP and the voltage VRN of the control signal RN exceed a predetermined voltage, the ON-resistance of the MOS transistor M2 is increased, and the ON-resistance of the MOS transistor 3 is decreased. Therefore, the voltage of the output signal DOUT is efficiently decreased to the ground voltage.

At the time t3, the internal circuit 101 begins to change the signal SA from the H level to the L level. Then, as the voltage of the signal SA is decreased, the voltage of the signal SB is decreased from the voltage VEX.

Because the voltages of the signals SA and SB are gradually decreased, the MOS transistor 4 is turned off, and the MOS transistor 1 is turned on, while the voltage of the output signal DOUT is gradually increased from the ground level.

As is obvious from FIG. 2, in the conventional output circuit, as the voltages at the source and the drain of the MOS transistor 3 are varied, the voltage at the drain of the MOS transistor 3 is increased, and the voltage VRN of the control signal RN is increased because of the parasitic capacitance between the drain and the gate of the MOS transistor 3.

Further, in the conventional output circuit, the voltages at the source and the drain of the MOS transistor 2 are varied, the voltage at the drain of the MOS transistor 2 is increased, and the voltage VRP of the control signal RP is increased because of the parasitic capacitance between the drain and the gate of the MOS transistor 2.

As the voltage VSN of the control signal SN and the voltage VSP of the control signal SP are increased, the ON-resistance of the MOS transistor 3 is decreased, and the ON-resistance of the MOS transistor 2 is increased. Therefore, the increase of the voltage of the output signal DOUT is slow. That is, the change of the output signal DOUT from the L level to the H level is significantly delayed from the change of the signal SA from the H level to the L level.

In contrast, in the output circuit O1 of the first embodiment, as the voltage of the signal SA input to one terminal of the capacitor Cp is decreased, the voltage VRP of the signal RP transferred through the connection to the other terminal has a tendency to decrease.

Therefore, the output circuit O1 of the first embodiment prevents the increase of the voltage VRP of the control signal RP. The voltages at the source and the drain of the MOS transistor 2 has a tendency to decrease as the voltage of the output signal DOUT is increased. That is, the voltage VRP of the control signal RP applied to the gate has a tendency to increase because of the parasitic capacitance between the drain and the gate of the MOS transistor 2 as the voltage at the drain of the MOS transistor 2 is increased. The output circuit O1 suppresses the tendency to increase of the voltage VRP by the capacitor Cp which has the tendency to decrease the voltage VRP.

Similarly, in the output circuit O1 of the first embodiment, as the voltage of the signal SB input to one terminal of the capacitor Cn is increased, the voltage VRN of the signal RN transferred through the connection to the other terminal has a tendency to decrease.

Therefore, the output circuit O1 of the first embodiment prevents the increase of the voltage VRN of the control signal RN. The voltages at the source and the drain of the MOS transistor 3 have a tendency to increase as the voltage of the output signal DOUT is increased. That is, the voltage VRN of the control signal RN applied to the gate has a tendency to increase because of the parasitic capacitance between the drain and the gate of the MOS transistor 3 as the voltage at the drain of the MOS transistor 3 is increased. The output circuit O1 suppresses the tendency to increase of the voltage VRN by the capacitor Cn which has the tendency to decrease the voltage VRN.

At the time t4, the output signal DOUT from the output circuit O1 is increased to the voltage VEX of the external power source.

In the conventional output circuit, as the voltage VSN of the control signal SN and the voltage VSP of the control signal SP are increased, the ON-resistance of the MOS transistor 3 is decreased, and the ON-resistance of the MOS transistor 2 is increased. Therefore, the decrease of the voltage of the output signal DOUT is slow, and the voltage of the output signal DOUT does not reach the voltage VEX.

Thus, the capacitors Cp and Cn transmit the decreasing voltages of the signals SB and SA to the connections transferring the control signals RP and RN. This suppresses the increase of the voltage VRP of the control signal RP and the voltage VRN of the control signal RN as the output signal DOUT is varied. Therefore, the delay between a change in the signal SA and a change in the output signal DOUT from the variation of the signal SA is shortened, and the operating speed can be increased.

Even when the voltage VRP of the control signal RP and the voltage VRN of the control signal RN are decreased to less than a predetermined voltage, the ON-resistance of the MOS transistor 2 is decreased, and the ON-resistance of the MOS transistor 3 is increased. Therefore, the voltage of the output signal DOUT is efficiently increased to the voltage VEX.

The output circuit O1 of the first embodiment prevents the variations of the control signals RP and RN by the capacitors Cp and Cn. The electric current capacities for outputting the control signals RP and RN need not be increased as long as the voltages VRP and VRN are maintained within a suitable range. Thus, the electric current consumption can be decreased.

Second Embodiment

Figure 3:
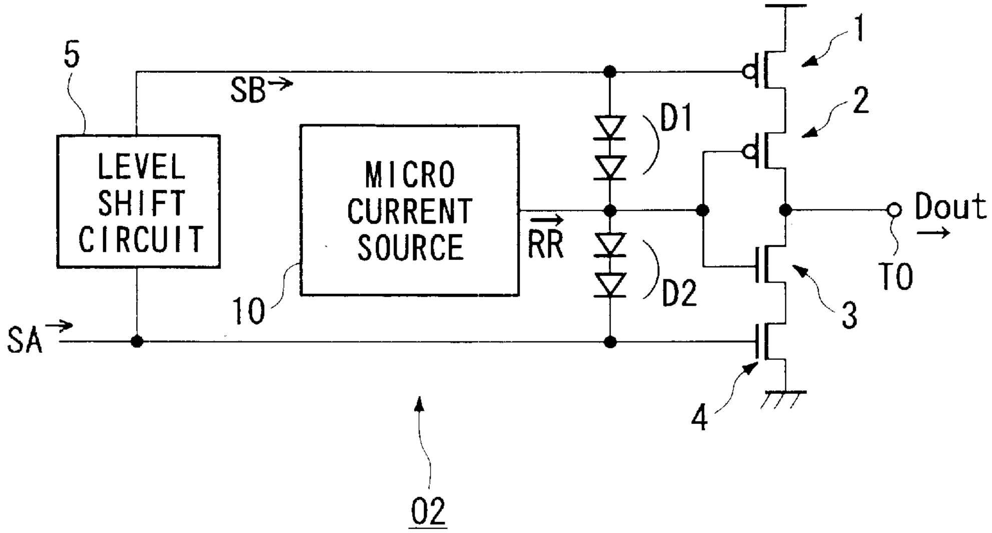
FIG. 3 is a block diagram showing the output circuit of the second embodiment of the present invention.

FIG. 3 is a block diagram showing the structure of the output circuit of the second embodiment of the present invention. The output circuit O2 is used instead of the output circuit 103 in the semiconductor integrated circuit shown in FIG. 9. The voltage VEX of an external power source is supplied to the semiconductor integrated circuit through an external terminal. The internal voltage reduction circuit 100 changes the voltage VEX into an internal voltage VINT to be supplied as a driving voltage to the internal circuit.

In FIG. 3, the same reference numbers are employed to designate like parts of the first embodiment, and a detailed description is omitted.

In FIG. 3, in the output circuit O2, a p-channel MOS transistor 1, a p-channel MOS transistor 2, an n-channel MOS transistor 3, and an n-channel MOS transistor 4 are connected in series. The gate oxide films of the MOS transistors have the same thickness as those of the MOS transistors in the internal circuit 101.

That is, the MOS transistors in the internal circuit 101 are formed by the gate oxide films with a thickness corresponding to the scaling law of fine structures. The internal voltage circuit 100 reduces the external voltage VEX to an internal voltage VINT which does not exceed the withstand voltage of the gate oxide film of the MOS transistor in the internal circuit 101.

The source of the MOS transistor 1 is connected to the terminal of an external power source for supplying the voltage VEX. A level shifter 5 outputs a signal SB to the gate of the MOS transistor 1. The drain of the MOS transistor 1 is connected to the source of the MOS transistor 2.

The drain of the MOS transistor 2 is connected to the drain of the MOS transistor 3. The connecting point of the drain of the MOS transistor 2 and the drain of the MOS transistor 3 are connected to an external terminal TO. The output circuit O2 changes the voltage of the internal signal SA into a signal DOUT, and outputs the signal DOUT from the external terminal TO.

A control signal RR at a voltage VRR is continuously input from a micro electric current power source 10 to the gate of the MOS transistor 2 and to the gate of the MOS transistor 3.

The drain of the MOS transistor 4 is connected to the source of the MOS transistor 3, the signal SA is input to the gate of the MOS transistor 4, and the source of the MOS transistor 4 is connected to the ground.

When the MOS transistor 1 is in the ON-state, the voltage VRR of the control signal RR sets the voltage between the gate and the source (or, the drain) of the MOS transistor 2 to less than the withstand voltage of the gate oxide film of the MOS transistor 2, and turns on the MOS transistor 2.

The withstand voltage means the upper limit of an allowable voltage which ensures the reliability of the gate oxide film.

Similarly, when the MOS transistor 4 is in the OFF-state, the voltage VRR of the control signal RR sets the voltage between the gate and the drain (or, the source) of the MOS transistor 3 to less than the withstand voltage of the gate oxide film of the MOS transistor 3, and turns on the MOS transistor 3.

For example, the voltage VRR is set to ½×VEX.

Thus, while the MOS transistors 2 and 3 are in the ON-state, the MOS transistor 4 is turned off in response to the input of the signal SA at the L level, the MOS transistor 1 is turned on in response to the input of the signal SB of the voltage VL, and the output circuit O2 outputs an output signal OUT at the H level which is the voltage VEX of the external power source since the signal SA is at the L level.

While the MOS transistors 2 and 3 are in the ON-state, the signal SB is increased to the H level which is the voltage VEX of the external power source in response to the signal SA at the H level which is the voltage VINT of the internal power source. Then, when the MOS transistor 1 is in the ON-state, the MOS transistor 4 is turned on in response to the input of the signal SA at the H level, and the output circuit O1 outputs the output signal OUT at the L level which is the ground level.

A diode D1 is inserted in the forward direction (direction of easy flow) between the gate of the MOS transistor 1 and the gate of the MOS transistor 2.

When the voltage of an output signal DOUT is changed from the L level to the H level, the diode D1 prevents the variations of the voltage VRR. That is, the parasitic capacitance between the gate and the drain of the MOS transistor 3 has a tendency to increase the voltage VRR applied to the gate of the MOS transistor 3 as the output signal DOUT is increased. The diode D1 suppresses the tendency to increase the voltage VRR by allowing the electric current to flow in the forward direction from the connection of the signal RR to the connection of the signal SA which is at the L level, drawing the electric charge. That is, the diode D1 prevents the variations of the voltage VRR by lowering the voltage of the control signal RR.

When the electric current flows through the diode D2 in the forward direction from the connection of the signal SB at the H level which is the voltage VEX to the connection of the signal RR, the electric current does not flow through the diode D1 since the voltage of the signal SB has been reduced.

The number of diodes D1 is determined to reduce the voltage VEX to the predetermined voltage VRR (for example, ½×VEX). The number of the diodes D2 is determined to reduce the increased voltage VRR with respect to the ground voltage to a predetermined voltage (for example, ½×VEX).

Figure 4:
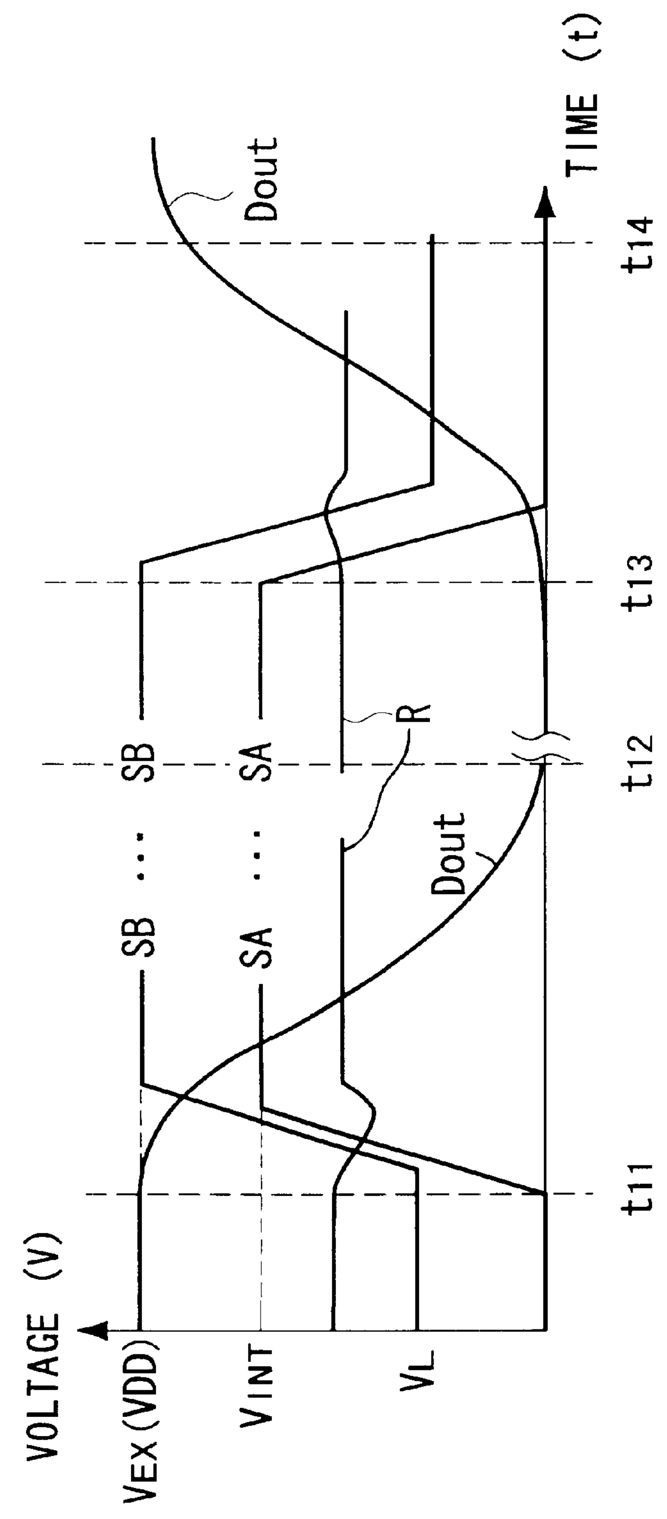
FIG. 4 is a timing chart showing the operation of the output circuit of the second embodiment of the present invention.

The operation of the second embodiment will now be explained with reference to FIGS. 3 and 4. FIG. 4 is a timing chart for explaining an example of the operation of the circuit shown in FIG. 3.

At the time t11, the internal circuit 101 begins to change the signal SA from the L level to the H level. As the voltage of the signal SA is increased, the voltage of the signal SB is increased from the voltage VL.

Since the voltages of the signals SA and SB are gradually increased, the voltage of the output signal DOUT gradually decreases from the voltage VEX as the MOS transistor 4 is being turned on, and while the MOS transistor 1 is being turned off.

In the output circuit O2 of the second embodiment shown in FIG. 3, as the output signal DOUT is decreased, the voltage VRR of the signal RR is decreased because of the parasitic capacitance between the gate and the drain of the MOS transistor 2.

Then, when the difference between the voltage of the signal SB and the voltage BRR of the control signal RR reaches the voltage of the current flowing through the diode D1 in the forward direction, the electric current flows from the connection of the signal SB to the connection for the control signal RR so as to increase the voltage VRR of the control signal RR flowing through the connection to the cathode.

Therefore, the output circuit O2 of the second embodiment prevents a decrease of the voltage VRR of the control signal RR. The voltages at the source and the drain of the MOS transistor 2 have a tendency to decrease as the voltage of the output signal DOUT is decreased.

That is, the voltage VRR of the control signal RR applied to the gate has a tendency to decrease because of the parasitic capacitance between the drain and the gate of the MOS transistor 2 as the voltage at the drain of the MOS transistor 2 is decreased. The output circuit O2 suppresses the tendency to increase of the voltage VRR by supplying the electric charge from the connection of the signal SB through the diode D1 to the connection of the control signal RR.

At that time, because the voltage of the signal SA has increased, electric current does not flow from the connection of the control signal RR through the diode D2 to the connection of the signal SA in the forward direction. Therefore, the electric charge in the connection of the control signal RR is not drawn, and the voltage of the control signal RR is not reduced.

Next, at the time t12, the output signal DOUT from the output circuit O2 of the second embodiment is decreased to the ground electric potential.

In the conventional output circuit shown in FIG. 2, as the voltage VSN of the control signal SN and the voltage VSP of the control signal SP are decreased, the ON-resistance of the MOS transistor 3 is increased, and the ON-resistance of the MOS transistor 2 is decreased. Therefore, the decrease of the voltage of the output signal DOUT from the H level to the L level is slow, and the voltage of the output signal DOUT does not reach the ground voltage.

At the time t13, the internal circuit 101 begins to change the signal SA from the H level to the L level. Then, as the voltage of the signal SA is decreased, the voltage of the signal SB is decreased from the voltage VEX.

Because the voltages of the signals SA and SB are gradually decreased, the MOS transistor 4 is turned off, and the MOS transistor 1 is turned on, while the voltage of the output signal DOUT is gradually increased from the ground level.

In contrast, in the output circuit O2 of the second embodiment shown in FIG. 3, as the output signal DOUT is increased, the voltage VRR of the signal RR begins to be increased because of the parasitic capacitance between the gate and the drain of the MOS transistor 2.

Then, when the difference between the voltage VRR of the control signal RR and the voltage of the signal SA reaches the voltage of the electric current which flows through the diode D1 in the forward direction, the electric current flows from the connection of the control signal RR to the connection of the signal SB, thereby reducing the voltage VRR of the control signal RR which flows through the connection to the anode.

Therefore, the output circuit O2 of the second embodiment prevents an increase of the voltage VRR of the control signal RR. The voltages at the source and the drain of the MOS transistor 2 have a tendency to increase as the voltage of the output signal DOUT is increased. That is, the voltage VRR of the control signal RR applied to the gate has a tendency to increase because of the parasitic capacitance between the drain and the gate of the MOS transistor 2 as the voltage at the drain of the MOS transistor 2 is increased. The output circuit O2 suppresses the tendency to increase the voltage VRR by supplying the electric charge from the connection of the control signal RR to the connection of the signal SB to decrease the voltage VRR.

At that time, because the voltage of the signal SB has increased, electric current does not flow from the connection of the signal SB through the diode D1 to the connection of the control signal RR in the forward direction. Therefore, the diode D1 does not allow the electric current to flow from the connection of the control signal SA to the connection of the control signal RR. Thus, the electric charge in the connection of the signal SA is not supplied to the connection of the control signal RR, and the voltage of the control signal RR is not reduced.

At the time t14, the output signal DOUT from the output circuit O2 is increased to the voltage VEX of the external power source.

In the conventional output circuit shown in FIG. 2, as the voltage VSN of the control signal SN and the voltage VSP of the control signal SP are increased, the ON-resistance of the MOS transistor 3 is decreased, and the ON-resistance of the MOS transistor 2 is increased. Therefore, the decrease of the voltage of the output signal DOUT from the L level to the H level is slow, and the voltage of the output signal DOUT does not reach the voltage VEX.

Thus, the diode D2 suppresses the tendency to increase of the voltage VRR of the control signal RR. The delay between a change in the signal SA and a change in the output signal DOUT can be shortened, and the operating speed can be increased.

As described above, the diodes D1 and D2 suppresses the increase of the voltage VRR of the control signal RR. Therefore, the delay between a change in the signal SA and a change in the output signal DOUT can be shortened, and the operating speed can be increased.

The output circuit O2 of the second embodiment prevents variations of the control signal RR by the diodes D1 and D2. The electric current capacities for outputting the control signals RP and RN need not be increased as long as the voltage VRR is maintained within a suitable range. Thus, the electric current consumption can be decreased.

Third Embodiment

Figure 5:
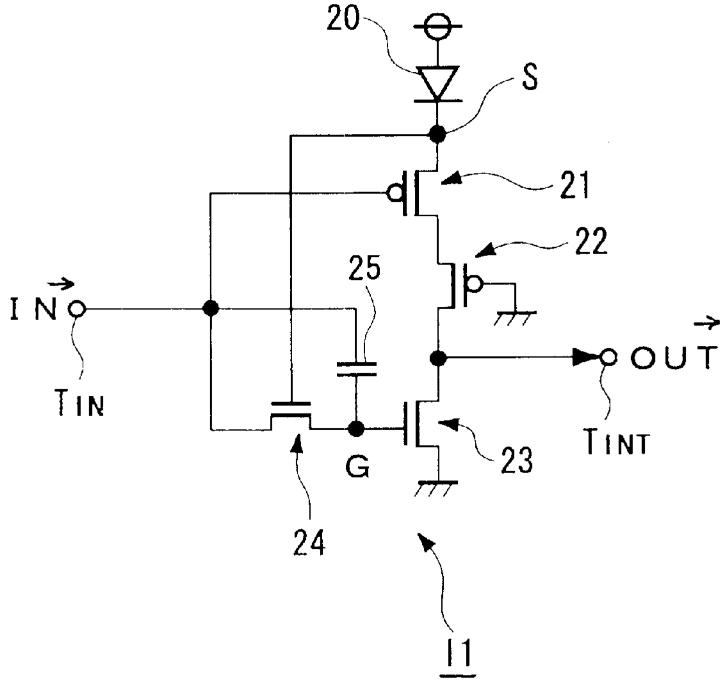
FIG. 5 is a block diagram showing the input circuit of the third embodiment of the present invention.

FIG. 5 is a block diagram showing the structure of the input circuit of the third embodiment of the present invention. The input circuit I1 is used instead of the input circuit 102 in the semiconductor integrated circuit. A voltage VEX (VDD) is supplied from an external power source through an external terminal to the semiconductor integrated circuit. An internal voltage reduction circuit 100 changes the voltage VEX into an internal voltage VINT, and supplies it as a voltage for driving an internal circuit 101.

In FIG. 5, in the input circuit I1, a diode 20, a p-channel MOS transistor 21, a p-channel MOS transistor 22, an n-channel MOS transistor 23, and an n-channel MOS transistor 4 are connected in series. The gate oxide films of the MOS transistors have the same thickness as those of the MOS transistors in the internal circuit 101.

That is, the MOS transistors in the internal circuit 101 are formed of the gate oxide films with the thickness corresponding to the scaling law for the fine structure. The internal voltage circuit 100 reduce the external voltage VEX to the internal voltage VINT which does not exceed the withstand voltage of the gate oxide film of the MOS transistor in the internal circuit 101.

The anode of the diode 20 is connected to the connection of the voltage VEX from the external power source, and the cathode of the diode 20 is connected to the source of the MOS transistor 21.

The diode 20 reduces the voltage VEX to the voltage VINT of the internal power source, and supplies the voltage VINT as the driving voltage to the input circuit I1.

The gate of the MOS transistor 21 is connected to an internal terminal TIN, and the drain of the MOS transistor 21 is connected to a source of the MOS transistor 23.

The gate of the MOS transistor 22 is connected to the ground, and the drain of the MOS transistor 22 is connected to the drain of the MOS transistor 23.

The connecting point of the drain of the MOS transistor 22 and the drain of the MOS transistor 23 is connected to the internal circuit 101, and acts as an internal terminal TINT for outputting an output signal OUT which is an inversion of the voltage of an input signal IN.

When the output signal OUT is at the L level which is the ground voltage, the MOS transistor 22 divides the voltage VINT so that the voltage at the drain of the MOS transistor 22 does not become the ground voltage.

Even when the input signal IN reaches the H level which is the voltage VEX, and when the voltage at the internal terminal TIN is decreased to the L level (the ground level), the voltage at the drain of the MOS transistor 21 does not decrease to the ground voltage because the voltage at the drain of the MOS transistor 21 is divided by the MOS transistor 22.

As a result, the voltage between the gate and the drain of the MOS transistor 21 does not exceed the withstand voltage of the gate oxide film of the MOS transistor 21.

The gate of the MOS transistor 33 is connected to the source of the n-channel MOS transistor 24, and the source of the MOS transistor 24 is connected to ground.

A control signal RP at a voltage VRP is continuously input from a micro electric current power source 6, and a control signal RN at a voltage VRN is continuously input from the micro electric current power source 6 to the gate of the MOS transistor 23.

The gate of the MOS transistor 24 is connected to the point S, and the drain of the MOS transistor 24 is connected to the input terminal TIN. The point S is a connection between the cathode of the diode 20 and the source of the MOS transistor 21. The voltage at the point G is a voltage VINT.

A capacitor 25 is inserted between the input terminal TIN and the point G. The point G is a connection between the gate of the MOS transistor 23 and the source of the MOS transistor 24.

The capacitor 25 increases the gate voltage of the MOS transistor 23 when the input signal is changed from the L level to the H level.

That is, when the input signal is changed from the L level to the H level, the change of the input signal IN is transmitted through the MOS transistor 24 to the gate of the MOS transistor 23.

However, the voltage at the gate of the MOS transistor 23, that is, at the point G, does not exceed the voltage VINT−VTN. VTN denotes the threshold voltage of the MOS transistor 24.

The change of the voltage at the point G to the H level is slow because of the time constant determined by the ON-resistance of the MOS transistor 24 and the capacitance of the gate of the MOS transistor 23. The ON-resistance of the MOS transistor 23 which has been turned on is not sufficiently low. Therefore, the time required to decrease the output signal OUT to the ground voltage is lengthened, and the reflection of the change of the input signal IN on the output signal OUT has a tendency to be delayed.

The voltage at one of the terminals of the capacitor 25 which is connected to the input terminal TIN is increased as the input signal IN is changed from the L level to the H level. Then, the voltage at the other terminal connected to the point G is increased, and the voltage at the gate of the MOS transistor 23 is increased.

Thus, the input circuit I1 decreases the ON-resistance of the MOS transistor 23 so that the change of the output signal OUT from the H level to the L level becomes fast.

The capacitor 25 reduces the gate voltage of the MOS transistor 23 when the input signal IN is changed from the H level to the L level.

That is, when the input signal IN is changed from the H level to the L level, the change of the input signal IN is transmitted through the MOS transistor 24 to the gate of the MOS transistor 23.

However, because the electric charge is drawn through the MOS transistor 23, the voltage at the gate of the MOS transistor 23, that is, at the point G, is slowly decreased to the ground voltage according to the time constant determined based on the ON-resistance of the MOS transistor 24 and the capacitance of the gate of the MOS transistor 23. Thus, the reflection of the change of the input signal IN on the output signal OUT has a tendency to be delayed.

The voltage at one of the terminals of the capacitor 25 which is connected to the input terminal TIN is decreased as the input signal IN is changed from the L level to the H level. Then, the voltage at the other terminal connected to the point G is decreased, and the voltage at the gate of the MOS transistor 23 is increased.

Thus, the input circuit I1 turns off the MOS transistor 23 at a high speed, and the output signal OUT is changed from the L level to the H level at a high speed.

The capacitance of the capacitor 25 is set so that the voltage at the point G does not exceed the withstand voltage of the gate oxide film of the MOS transistor 23 when the input signal IN is changed from the L level to the H level, and so that the voltage at the point G does not reduce to a voltage which exceeds the withstand voltage of the gate oxide film of the MOS transistor 23.

Figure 6:
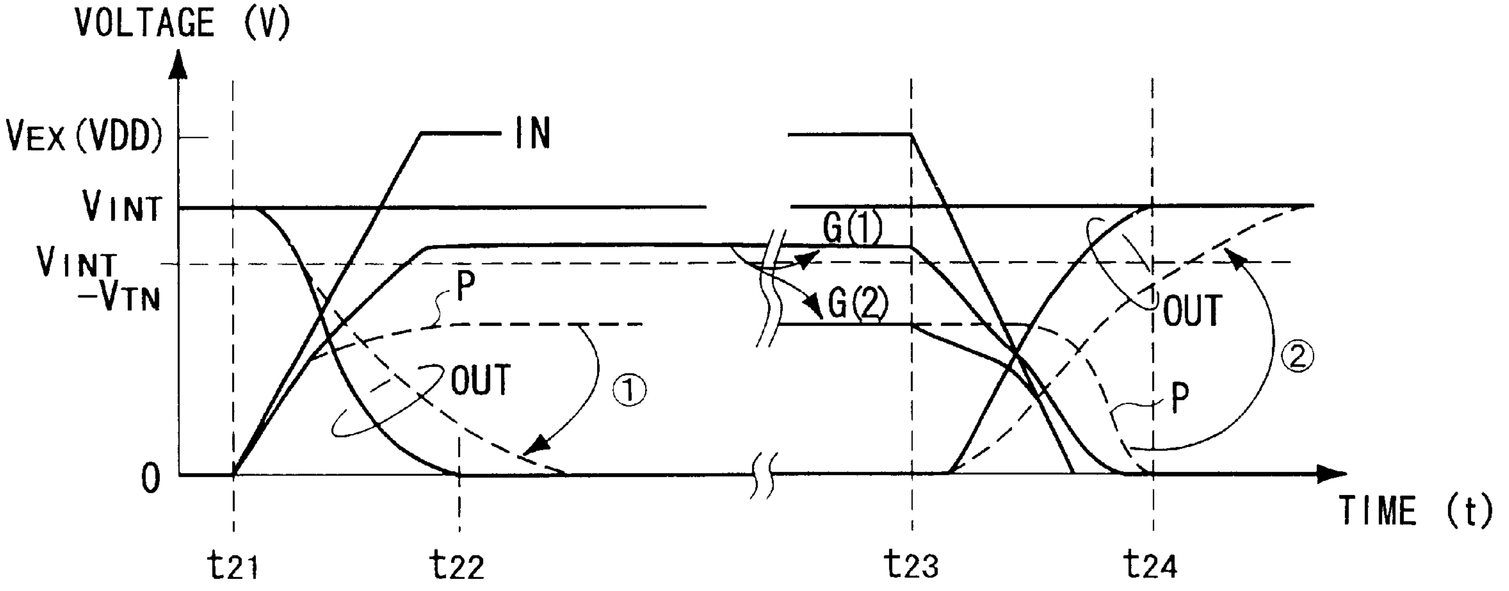
FIG. 6 is a timing chart showing the operation of the input circuit of the third embodiment of the present invention.

The operation of the third embodiment will now be explained with reference to FIGS. 5 and 6. FIG. 6 is a timing chart for explaining an example of the operation of the circuit shown in FIG. 5.

In FIG. 6, the output signal OUT is indicated by two lines which are the solid line and the dashed line. The solid line indicates the operation of the output circuit 11 of the third embodiment shown in FIG. 5. The dashed line indicates the operation of the conventional output circuit shown in FIG. 10.

At the time t21, when the input signal IN from the external circuit begins to change from the L level to the H level, the electric charge is supplied to the point G through the MOS transistor 24, and the voltage at the point G is increased by the capacitor 25. Thus, the voltage at the point G exceeds VINT−VTN.

Accordingly, the ON-resistance of the MOS transistor 23 is decreased, and the amount of the electric current which flows through the MOS transistor 23 is increased. Therefore, the voltage of the output signal OUT is decreased at a high speed.

Figure 10:
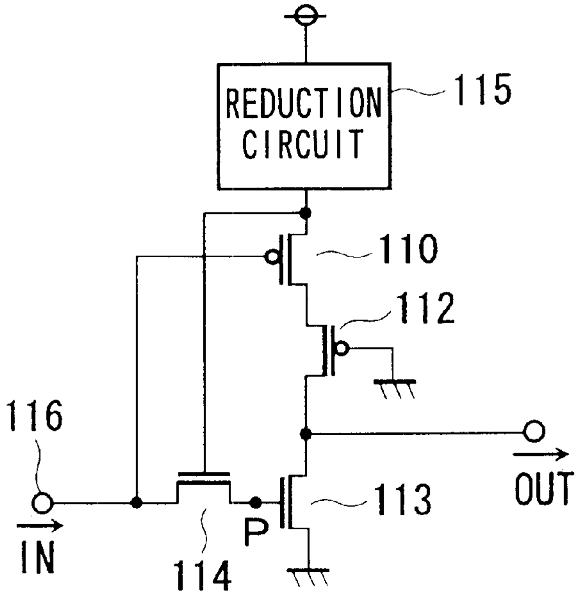
FIG. 10 is a block diagram showing the structure of the conventional input circuit.

Thus, in FIG. 10, the change in the voltage at the point P is slow according to the time constant based on the ON-resistance of the MOS transistor 114 and the parasitic capacitance of the MOS transistor 113. Therefore, the ON-resistance of the MOS transistor 113 is not decreased, and the decrease of the output signal OUT is slower than that of the input circuit 11.

At the time t22, the input circuit 11 decreases the voltage of the output signal OUT to the ground voltage. In contrast, the input circuit of FIG. 10 cannot decrease the voltage of the output signal OUT to the ground voltage because the voltage at the point P has not been increased, and because the ON-resistance of the MOS transistor 113 has not been decreased.

At the time t23, the input signal IN from the external circuit begins to change from the H level to the L level, the electric charge is drawn from the point G through the MOS transistor 24, the voltage at the point G is reduced by the capacitor 25, and the voltage at the point G is therefore immediately decreased to the ground voltage.

As the signal is changed from the H level to the L level while the voltage at the point G is not discharged as indicated by the lines G(1), the voltage at the point G is immediately decreased to VINT−VTN by the capacitor 25, and then follows the change of the input signal IN by the MOS transistor 24 which has been turned on.

Further, as the signal is changed from the H level to the L level while the voltage at the point G is decreased to the voltage at the point P as shown by the lines G(2), the MOS transistor 24 has been turned on. Therefore, when the voltage of the input signal IN is decreased to less than the voltage at the point G indicated by the line G(2), the voltage at the point G is immediately decreased by the capacitor 25, following the change of the voltage of the input signal IN.

Thus, the MOS transistor 23 is turned off, and the voltage of the output signal OUT is immediately increased because the electric current does not flow through the MOS transistor 23.

At the time t24, the input circuit 11 has increased the voltage of the output signal OUT to the voltage VINT of the internal power source. In contrast, in the input circuit of FIG. 10, the MOS transistor 113 is not turned off because the voltage at the point P is not decreased, and therefore the voltage of the output signal OUT cannot be increased to the voltage VINT.

As described above, according to the input circuit 11 of the third embodiment, the voltage at the gate of the MOS transistor 23 immediately follows the change of the voltage of the input signal IN by means of the capacitor 25. Therefore, the MOS transistor 23 can be turned on or off at a high speed, thereby shortening the delay of the change of the output signal OUT from the change of the input signal IN. Thus, the operating speed can be increased when the voltage of the input signal IN is changed.

Fourth Embodiment

Figure 7:
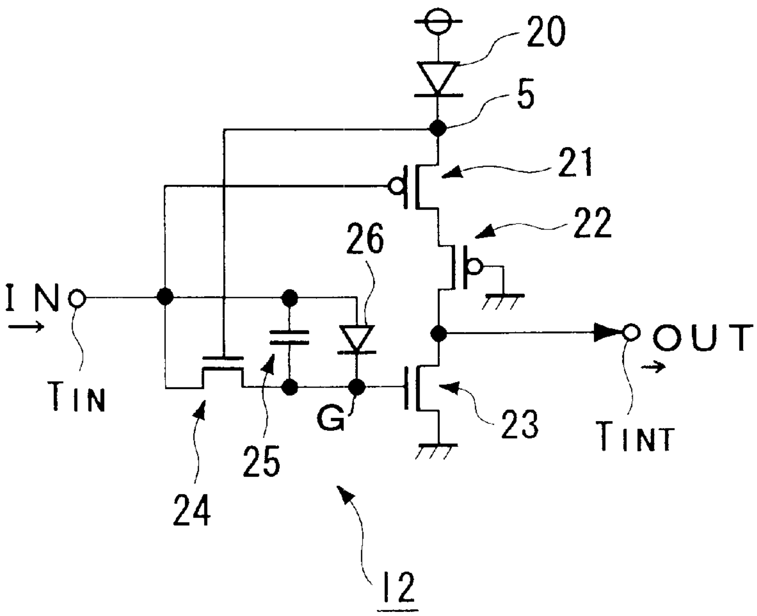
FIG. 7 is a block diagram showing the input circuit of the fourth embodiment of the present invention.

An input circuit 12 of the fourth embodiment is shown in FIG. 7. The difference between the input circuit 12 of the present embodiment and the third embodiment is that a diode 26 is inserted between an input terminal TIN and a point G in parallel to a capacitor 25. The other elements in the fourth embodiment are similar to those in the third embodiment, and detailed descriptions will be omitted.

When the voltage of an input signal IN is changed from the L level to the H level (from the ground voltage to the voltage VEX), the diode 26 increases the voltage at the point G to the voltage VINT−Vf, decreases the ON-resistance of the MOS transistor 23, and decreases the voltage of the output signal OUT to the ground voltage more immediately than the input circuit I1 of the third embodiment. Reference character Vf denotes a reduced voltage when an electric current flows through the diode 26.

When the diode 26 comprises a p-n junction of a p-diffusion layer and an n-diffusion layer, the diode 26 and the capacitor 25 can be produced as a single structure, or the diode 26 can be produced as a part of the capacitor 25.

Figure 8:
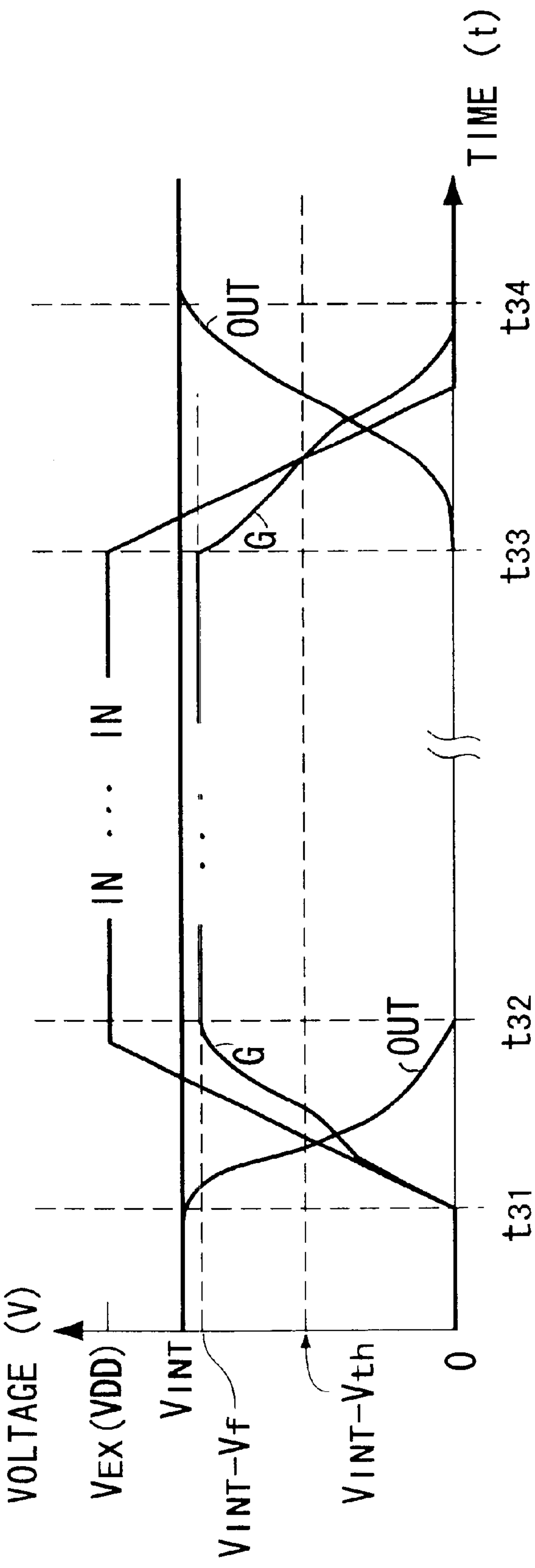
FIG. 8 is a timing chart showing the operation of the input circuit of the fourth embodiment of the present invention.

The operation of the fourth embodiment will now be explained with reference to FIGS. 7 and 8. FIG. 8 is a timing chart for explaining an example of the operation of the circuit shown in FIG. 7.

At the time t31, when the input signal IN from the external circuit begins to change from the L level to the H level, the electric charge is supplied to the point G through the MOS transistor 24, and the voltage at the point G is increased by the capacitor 25. Further, the electric current which flows through the diode 26 in the forward direction immediately increases the voltage at the point G to VINT−Vf.

Accordingly, the ON-resistance of the MOS transistor 23 is decreased, and the amount of the electric current which flows through the MOS transistor 23 is increased. Therefore, the voltage of the output signal OUT is decreased at a high speed.

At the time t32, the input circuit 12 decreases the voltage of the output signal OUT to the ground voltage.

At the time t33, the input signal IN from the external circuit begins to change from the H level to the L level, the electric charge is drawn from the point G through the MOS transistor 24, the voltage at the point G is reduced by the capacitor 25, and the voltage at the point G is therefore immediately decreased to the ground voltage.

As the signal is changed from the H level to the L level, the voltage at the point G is immediately decreased to VINT−VTN by the capacitor 25, and then follows the change of the input signal IN by the MOS transistor 24 which has been turned on.

Thus, the MOS transistor 23 is turned off, and the voltage of the output signal OUT is immediately increased because an electric current does not flow through the MOS transistor 23.

At the time t24, the input circuit 12 has increased the voltage of the output signal OUT to the voltage VINT of the internal power source.

As described above, in addition to the effects of the third embodiment, the input circuit 12 of the fourth embodiment achieves the effect that, when the input signal IN is changed from the L level to the H level, the off action can be immediately completed because the diode 26 increases the voltage at the point G to VINT−Vf. Therefore, the delay between a change in the input signal In and a change in the output signal OUT can be shortened. Thus, the operating speed can be increased.

Figure 9:
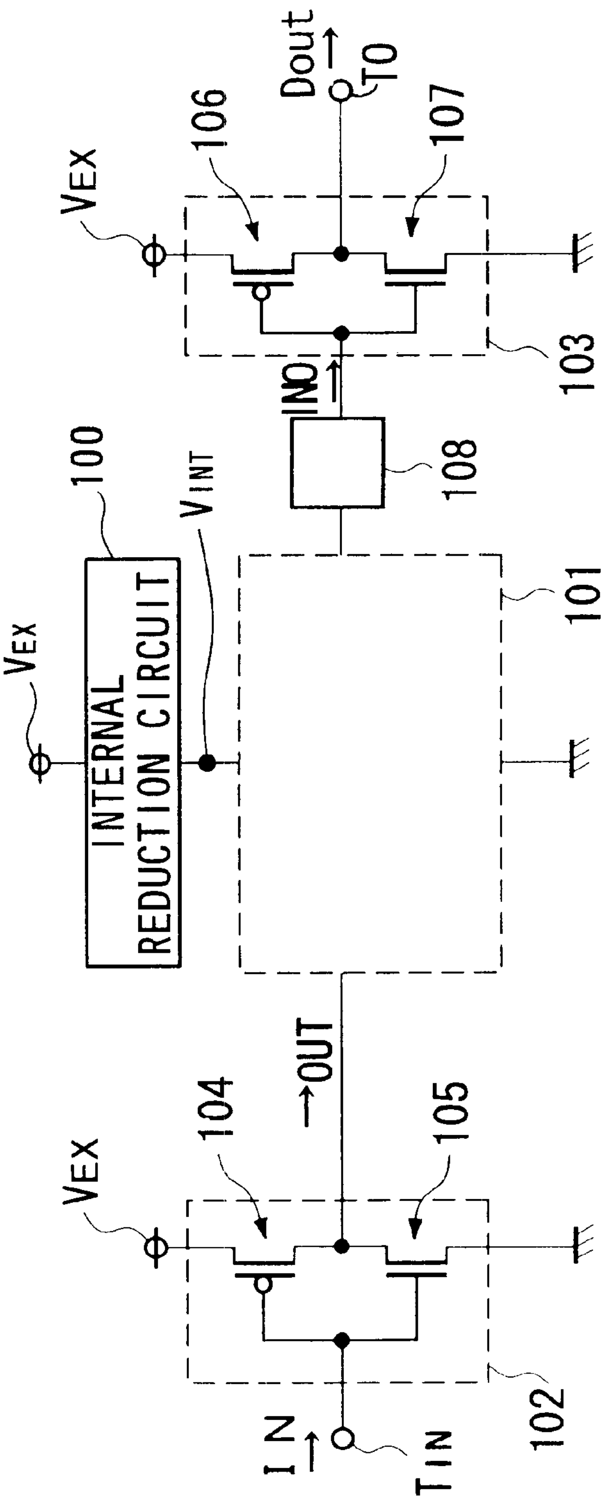
FIG. 9 is a conceptual diagram showing a conventional semiconductor integrated circuit having a reduction circuit for reducing an internal voltage.

The input circuit 102 and the output circuit 103 shown in FIG. 9 can be replaced with the output circuit O1 of the first embodiment, the output circuit O2 of the second embodiment, the input circuit I1 of the third embodiment, and the input circuit I2 of the fourth embodiment. In this case, the semiconductor integrated circuit can be produced with MOS transistors with the gate oxide films having the same thickness.

The voltage of the signal output from the input circuit 102 and the voltage of the signal which the internal circuit outputs to the output circuit do not necessarily have to be the same.

That is, the internal circuit may increase or decrease the voltage of the signal from the input circuit 102, and may output the signal to the output circuit 103.

As the result, the number of steps in the manufacturing process can be reduced (four steps can be eliminated) as compared with the process for manufacturing the conventional integrated circuit with the MOS transistors with different thicknesses of the input circuit and the output circuit. Therefore, the production time can be shortened, the manufacturing costs can be reduced, and the prices of the chips can be reduced.

This invention may be embodied in other forms or carried out in other ways without departing from the spirit thereof. The present embodiments are therefore to be considered in all respects illustrative and not limiting, the scope of the invention being indicated by the appended claims, and all modifications falling within the meaning and range of equivalency are intended to be embraced therein.

What is claimed is:

1. An output circuit which produces an external signal at a first voltage from an internal signal at a reduced second voltage and which outputs the external signal from an output terminal, comprising:

first and second MOS transistors having drains connected to the output terminal, and having gates connected to a control signal line;

a third MOS transistor having a source connected to a power source of the first voltage, and having a drain connected to a source of the first MOS transistor;

a fourth MOS transistor having a source connected to ground, having a drain connected to a source of the second MOS transistor, and having a gate connected to an internal signal line;

a voltage changer, which changes the voltage of the internal signal, connected to the gate of the third MOS transistor;

a first capacitor connected between a gate of the first MOS transistor and a gate of the third MOS transistor; and a second capacitor connected between a gate of the second MOS transistor and a gate of the fourth MOS transistor.

2. An output circuit according to claim 1, wherein the first, second, third, and fourth MOS transistors, the voltage changer, and the first and second capacitor are formed in a semiconductor integrated circuit.

3. An output circuit according to claim 1, wherein a capacitance of the first capacitor is the same as a parasitic capacitance between the gate and the drain of the first MOS transistor, and a capacitance of the second capacitor is the same as a parasitic capacitance between the gate and the drain of the second MOS transistor.

4. An output circuit according to claim 1, wherein the voltage changer outputs the control signal at the first voltage when the internal signal is at the ground voltage, and outputs the control signal at a voltage less than a withstand voltage of a gate oxide film when the internal signal is at the second voltage.

5. An output circuit which produces an external signal at a first voltage from an internal signal at a reduced second voltage and which outputs the external signal from an output terminal, comprising:

first and second MOS transistors of which drains are connected to the output terminal, and of which gates connected to a control signal line;

a third MOS transistor having a source connected to a power source of the first voltage, and having a drain connected to a source of the first MOS transistor;

a fourth MOS transistor having a source connected to a ground, having a drain connected to a source of the second MOS transistor, and having a gate connected to an internal signal line;

a voltage changer, which changes the voltage of the internal signal, connected to the gate of the third MOS transistor;

a first diode connected between a gate of the first MOS transistor and a gate of the third MOS transistor; and a second diode connected between a gate of the second MOS transistor and a gate of the fourth MOS transistor.

6. An output circuit according to claim 5, wherein the first, second, third, and fourth MOS transistors, the voltage changer, and the first and second diodes are formed in a semiconductor integrated circuit.

7. An output circuit according to claim 5, wherein the number of the first diodes connected in series is determined depending on a difference in voltage between the gate of the third transistor and the gate of the first transistor, and the number of the second diodes connected in series is determined depending on a difference in voltage between the gate of the second transistor and the gate of the third transistor.

8. An output circuit according to claim 1, wherein the voltage changer outputs the control signal at the first voltage when the internal signal is at the ground voltage, and outputs the control signal at a voltage less than a withstand voltage of a gate oxide film when the internal signal at the second voltage.

9. An input circuit which produces an internal signal at a reduced second voltage from an external signal at a first voltage and which inputs the internal signal to an input terminal, comprising:

a first MOS transistor having a source connected to a first terminal at the second voltage, and having a gate connected to the input terminal;

a second MOS transistor having a source connected to a drain of the first MOS transistor, and having a gate connected to a ground;

a third MOS transistor having a drain connected to a drain of the second MOS transistor, and having a source connected to the ground;

a fourth MOS transistor having a source connected to a gate of the third MOS transistor, having a gate connected to a line at the second voltage, and having a drain connected to the input terminal; and a capacitor connected between the gate of the third MOS transistor and the input terminal.

10. An input circuit according to claim 9, wherein the first, second, third, and fourth MOS transistors, and the capacitor are formed in a semiconductor integrated circuit.

11. An input circuit according to claim 9, further comprising a diode connected between the gate of the third MOS transistor and the input terminal in parallel to the capacitor.

12. An input circuit according to claim 9, further comprising a diode connected between a power source of the first voltage and the first terminal.

13. An input circuit according to claim 9, wherein a capacitance of the capacitor is set so that a voltage between the gate and the source, or the drain, of the third MOS transistor does not exceed a withstand voltage of a gate oxide film when the input terminal is increased to the first voltage.

* * * * *